US012581674B2

(12) United States Patent  
Gong et al.

(10) Patent No.: US 12,581,674 B2  
(45) Date of Patent: Mar. 17, 2026

(54) SEMICONDUCTOR DEVICE INCLUDING FIRST P-TYPE BODY REGION CONTACT REGION

(71) Applicant: SUZHOU ORIENTAL SEMICONDUCTOR CO., LTD., Jiangsu (CN)

(72) Inventors: Yi Gong, Jiangsu (CN); Wei Liu, Jiangsu (CN); Lei Liu, Jiangsu (CN); Rui Wang, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 486 days.

(21) Appl. No.: 18/016,767

(22) PCT Filed: Nov. 19, 2021

(86) PCT No.: PCT/CN2021/131693  
§ 371 (c)(1),  
(2) Date: Jan. 18, 2023

(87) PCT Pub. No.: WO2022/174641  
PCT Pub. Date: Aug. 25, 2022

(65) Prior Publication Data  
US 2024/0038877 A1 Feb. 1, 2024

(30) Foreign Application Priority Data

Feb. 19, 2021 (CN) .......................... 202110195555.6

(51) Int. Cl.  
*H10D 12/00* (2025.01)  
*H10D 62/10* (2025.01)

(52) U.S. Cl.  
CPC ........... *H10D 12/441* (2025.01); *H10D 62/10* (2025.01); *H10D 62/127* (2025.01)

(58) Field of Classification Search  
CPC .... H10D 12/441; H10D 62/10; H10D 62/127; H10D 12/481; H10D 62/142;  
(Continued)

(56) References Cited

U.S. PATENT DOCUMENTS

2009/0057713 A1 3/2009 Hirler  
2012/0181575 A1* 7/2012 Pfirsch ................. H10D 62/127  
257/E29.197

(Continued)

FOREIGN PATENT DOCUMENTS

| CN | 102593168 A | 7/2012 |
| CN | 105633127 A | 6/2016 |
| CN | 106373995 A | 2/2017 |

OTHER PUBLICATIONS

PCT/CN2021/131693 International Search Report dated Feb. 17, 2022.

*Primary Examiner* — Mohammad M Hoque  
(74) *Attorney, Agent, or Firm* — Michael Best & Friedrich LLP

(57) ABSTRACT

Provided is a semiconductor device. The semiconductor device includes a semiconductor substrate and p-type body regions are disposed at a top of the semiconductor substrate. The p-type body regions are in contact with an emitter metal layer. The semiconductor substrate includes at least one first region, and a region of the semiconductor substrate outside the at least one first region is a second region. Each of p-type body regions in the at least one first region is provided with a first p-type body region contact region, and the emitter metal layer is in contact with the first p-type body region contact region and forms an ohmic contact with the first p-type body region contact region. Each of p-type body regions in the second region forms no ohmic contact with the emitter metal layer.

8 Claims, 2 Drawing Sheets

(58) Field of Classification Search
   CPC .. H10D 62/124; H10D 12/032; H10D 84/641;
                       H01L 23/58; H01L 23/60
   USPC ...................................................... 257/107
   See application file for complete search history.

(56)                References Cited

U.S. PATENT DOCUMENTS

2016/0211257 A1 *   7/2016  Yoshida  ............... H10D 84/811
2018/0097094 A1     4/2018  Naito
2019/0081162 A1 *   3/2019  Gejo  ................... H10D 62/142

* cited by examiner

SEMICONDUCTOR DEVICE INCLUDING FIRST P-TYPE BODY REGION CONTACT REGION

CROSS-REFERENCE TO RELATED APPLICATION(S)

This is a national stage application filed under 37 U.S.C. 371 based on International Patent Application No. PCT/CN2021/131693, filed Nov. 19, 2021, which claims priority to Chinese Patent Application No. 202110195555.6 filed with the China National Intellectual Property Administration (CNIPA) on Feb. 19, 2021, the disclosures of which are incorporated herein by reference in their entireties.

TECHNICAL FIELD

The present application belongs to the technical field of semiconductor devices, and for example, relates to a power semiconductor device.

BACKGROUND

For a power semiconductor device in the related art, a Miller capacitance of the device is typically reduced so that a switching speed is improved so as to reduce a switching loss. However, too fast a switching speed results in large voltage and current oscillations, which leads to a serious electromagnetic interference (EMI) during the application of the power semiconductor device.

SUMMARY

The present application provides a semiconductor device, so as to reduce an EMI caused during the application of the semiconductor device.

The present application provides a semiconductor device.

The semiconductor device includes a semiconductor substrate, n-type collector regions, p-type collector regions, an n-type drift region, and p-type body regions.

The n-type collector regions and the p-type collector regions are alternately arranged at a bottom of the semiconductor substrate.

The n-type drift region is disposed in the semiconductor substrate and above the n-type collector regions and the p-type collector regions.

The p-type body regions are disposed at a top of the semiconductor substrate, where the p-type body regions are in contact with an emitter metal layer.

The semiconductor substrate includes at least one first region, and a region of the semiconductor substrate outside the at least one first region is a second region.

Each of p-type body regions in the at least one first region is provided with a first p-type body region contact region, and the emitter metal layer is in contact with the first p-type body region contact region and forms an ohmic contact with the first p-type body region contact region.

Each of p-type body regions in the second region forms no ohmic contact with the emitter metal layer.

DETAILED DESCRIPTION

The technical solution of the present application is completely described hereinafter in conjunction with drawings in embodiments of the present application. It is to be understood that the terms used in the present application such as "have", "comprise", and "include" do not exclude the presence of at least one other element or a combination thereof.

It is to be understood by those skilled in the art that a power semiconductor device chip includes a cell region and a terminal region. The cell region is a current working region, and the terminal region is configured to increase withstand voltages of cells on the edge of the cell region. The semiconductor device described in the embodiments of the present application refers to the cell region in the power semiconductor device chip.

Figures 1, 2:
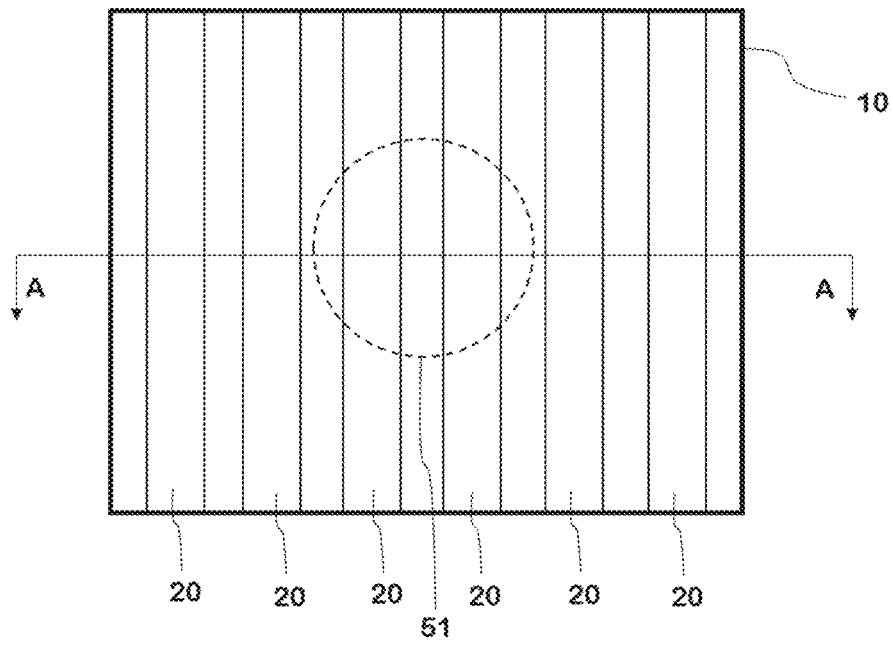
FIG. 1 is a top view of a first embodiment of a semiconductor device according to the present application.
FIG. 2 is a sectional view of a structure shown in FIG. 1 along an AA direction.

FIG. 1 is a top view of a first embodiment of a semiconductor device according to the present application, and FIG. 2 is a sectional view of a structure shown in FIG. 1 along an AA direction. As shown in FIGS. 1 and 2, the semiconductor device of the present application includes a semiconductor substrate 10 which is typically a silicon substrate, n-type collector regions 11 and p-type collector regions 13 which are alternately arranged at a bottom of the semiconductor substrate 10, an n-type drift region 12 disposed above the n-type collector regions 11 and the p-type collector regions 13, and p-type body regions 20 disposed at a top of the semiconductor substrate 10. The p-type body regions 20 form a PN junction structure with the n-type drift region 12. The cell region of the semiconductor device chip includes several p-type body regions. Only six p-type body regions 20 are exemplarily shown in FIGS. 1 and 2. The semiconductor device of the present application further includes n-type emitter regions 21 disposed in the p-type body regions 20, where the p-type body regions 20 and the n-type emitter regions 21 are each in contact with an emitter metal layer 17.

In one embodiment, an n-type field cut-off region may be further disposed in the semiconductor substrate 10, where the n-type field cut-off region is disposed above the n-type collector regions 11 and the p-type collector regions 13 and below the n-type drift region 12. The n-type field cut-off region is a common choice in the related art, which is not specifically shown in the embodiments of the present application.

As shown in FIG. 1, the semiconductor substrate 10 includes at least one first region 51 in a top view of an upper surface of the semiconductor substrate 10. The number and shape of the at least one first region 51 are not specifically limited in the present application. Only one first region 51 is exemplarily shown in FIG. 1 and the first region 51 has a circular structure. A region of the semiconductor substrate 10 outside the at least one first region 51 is defined as a second region.

Each of p-type body regions 20 in the at least one first region 51 is provided with a first p-type body region contact region 22. The emitter metal layer 17 is in contact with the first p-type body region contact region 22 and forms an ohmic contact with the first p-type body region contact region 22. The doping concentration of the first p-type body region contact region 22 is higher than the doping concentration of a p-type body region 20. Therefore, the first p-type body region contact region 22 increases the doping concentration of the position where the p-type region 20 is in contact with the emitter metal layer 17 so that each of p-type body regions 20 in the at least one first region 51 forms the ohmic contact with the emitter metal layer 17.

Each of p-type body regions 20 in the second region has a relatively low doping concentration. Therefore, each of the p-type body regions 20 in the second region forms no ohmic contact with the emitter metal layer 17 after being in contact with the emitter metal layer 17. Optionally, a second p-type body region contact region 23 may be formed in at least one of the p-type body regions 20 in the second region. However, the doping concentration of the second p-type body region is lower than the doping concentration of the first p-type body region contact region 22 so that the second p-type body region contact region 23 forms no ohmic contact with the emitter metal layer 17 after being in contact with the emitter metal layer 17, or the second p-type body region contact region 23 forms, after being in contact with the emitter metal layer 17, the ohmic contact having a relatively high resistance with the emitter metal layer 17.

As shown in FIG. 2, the semiconductor device of the present application further includes gate structures, each of the gate structures includes a gate dielectric layer 14 and a gate 15. Each of the gate structures is isolated from the emitter metal layer 17 via an interlayer insulating layer 16. In FIG. 2, the gate structures of the semiconductor device of the present application are planar gate structures. In one embodiment, the gate structures of the semiconductor device of the present application may be trench gate structures which are a common choice in the related art and not specifically shown in the embodiments of the present application.

In the semiconductor device of the present application, each of the p-type body regions 20 in the at least one first region 51 forms the ohmic contact with the emitter metal layer 17 via the first p-type body region contact region 22, and each of the p-type body regions 20 in the second region forms no ohmic contact with the emitter metal layer 17. The p-type body regions 20 forming no ohmic contact have unfixed electric potentials, which results in changes in a threshold voltage Vth. In addition, if a p-type body region 20 forming no ohmic contact is farther away from a p-type body region 20 forming the ohmic contact, a greater difference exists between a threshold voltage Vth of the p-type body region forming no ohmic contact and a threshold voltage Vth of the p-type body region forming the ohmic contact. That is, a difference between a threshold voltage of a p-type body region in the second region close to the first region and a threshold voltage of a p-type body region in the first region is less than a difference between a threshold voltage of a p-type body region in the second region far away from the first region and the threshold voltage of the p-type body region in the first region. Thus, the semiconductor device of the present application has a gradually changing threshold voltage Vth. A current and a voltage are not easily changed abruptly when the semiconductor device is turned on and off, which may reduce a voltage oscillation, a current oscillation, and an EMI caused during the application of the semiconductor device and may improve the reverse recovery characteristic of the device.

Figure 3:
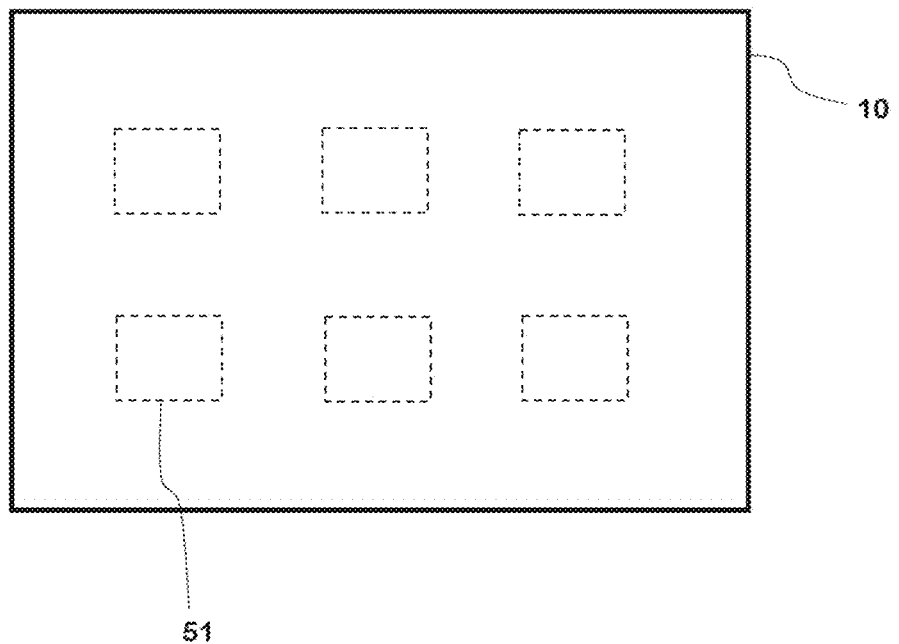
FIG. 3 is a top view of a second embodiment of a semiconductor device according to the present application.

FIG. 3 is a top view of a second embodiment of the semiconductor device according to the present application. In FIG. 3, a semiconductor substrate 10 includes six first regions 51. The first regions 51 are rectangular. In one embodiment, each of the first regions 51 may be a regular pattern such as a polygon (for example, a triangle, a square, a regular polygon, a rectangle, a parallelogram, and a trapezoid), a circle, or an ellipse. In one embodiment, each of the first regions 51 may be an irregular pattern. The shape of the first regions 51 is not limited in the embodiments of the present application. A top-view shape of each of the first regions 51 only needs to be a closed pattern, for example, a closed pattern which straight lines and/or curves are successively connected end to end to form.

In the top views shown in FIGS. 1 and 3, that the first region is surrounded by the second region is used as an example for the description. It is to be noted that a relative positional relationship between the first region and the second region is not limited in the embodiments of the present application. The relative positional relationship may be as shown in FIGS. 1 and 3, that the second region is surrounded by the first region, or that the first region and the second region are successively disposed along a direction parallel to the plane where the semiconductor substrate is located.

What is claimed is:

1. A semiconductor device including a first p-type body region contact region, comprising:
   a semiconductor substrate;
   n-type collector regions and p-type collector regions alternately arranged at a bottom of the semiconductor substrate;
   an n-type drift region disposed in the semiconductor substrate and above the n-type collector regions and the p-type collector regions; and
   p-type body regions disposed at a top of the semiconductor substrate, wherein the p-type body regions are in contact with an emitter metal layer;
   wherein the semiconductor substrate comprises at least one first region, and a region of the semiconductor substrate outside the at least one first region is a second region;
   each of p-type body regions in the at least one first region is provided with the first p-type body region contact region, and the emitter metal layer is in contact with the first p-type body region contact region and forms an ohmic contact with the first p-type body region contact region; and
   each of p-type body regions in the second region forms no ohmic contact with the emitter metal layer;
   wherein the semiconductor device further comprises n-type emitter regions disposed in the p-type body regions of the at least one first region and the second region, wherein the n-type emitter regions are in contact with the emitter metal layer.

2. The semiconductor device according to claim 1, wherein a shape of the at least one first region comprises at least one of a polygon, a circle, or an ellipse.

3. The semiconductor device according to claim 1, wherein at least one of the p-type body regions in the second region is provided with a second p-type body region contact region, and a doping concentration of the second p-type body region contact region is lower than a doping concentration of the first p-type body region contact region.

4. The semiconductor device according to claim 3, wherein the emitter metal layer is in contact with the second p-type body region contact region but no ohmic contact is formed between the emitter metal layer and the second p-type body region contact region.

5. The semiconductor device according to claim 1, further comprising an n-type field cut-off region disposed in the semiconductor substrate, wherein the n-type field cut-off region is disposed above the n-type collector regions and the p-type collector regions and below the n-type drift region.

6. The semiconductor device according to claim 1, further comprising gate structures, each of the gate structures comprises a gate dielectric layer and a gate.

7. The semiconductor device according to claim 6, wherein the gate structures are planar gate structures or trench gate structures.

8. The semiconductor device according to claim 1, wherein a difference between a threshold voltage of a p-type body region in the second region close to the first region and a threshold voltage of a p-type body region in the first region is less than a difference between a threshold voltage of a p-type body region in the second region far away from the first region and the threshold voltage of the p-type body region in the first region.

* * * * *